(12) United States Patent
Tsironis

(10) Patent No.: US 11,879,920 B1
(45) Date of Patent: Jan. 23, 2024

(54) HIGH POWER DUAL PROBE TUNER AND METHOD

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 162 days.

(21) Appl. No.: 16/928,273

(22) Filed: Jul. 14, 2020

(51) Int. Cl.
G01R 27/28 (2006.01)
G01R 35/00 (2006.01)

(52) U.S. Cl.
CPC .......... *G01R 27/28* (2013.01); *G01R 35/005* (2013.01)

(58) Field of Classification Search
CPC ............................ G01R 27/28; G01R 35/005
See application file for complete search history.

(56) References Cited

U.S. PATENT DOCUMENTS

| | | | | |
|---|---|---|---|---|
| 4,967,173 A * | 10/1990 | Watson | .................. | G01R 27/32 333/260 |
| 5,910,754 A | 6/1999 | Simpson | | |
| 6,898,419 B1 * | 5/2005 | Fayeski | ................. | H03J 1/0008 455/120 |
| 7,548,069 B2 * | 6/2009 | Simpson | ................ | G01R 27/28 324/537 |
| 8,319,504 B2 * | 11/2012 | Roff | ....................... | G01R 27/30 324/638 |
| 9,148,127 B1 * | 9/2015 | Lee | ..................... | G01R 1/06705 |
| 9,543,631 B1 * | 1/2017 | Antkowiak | ............. | H01P 5/183 |
| 9,625,556 B1 | 4/2017 | Tsironis | | |
| 9,666,928 B1 | 5/2017 | Tsironis | | |
| 9,712,134 B2 * | 7/2017 | Dudkiewicz | ............. | H03H 7/40 |

OTHER PUBLICATIONS

"Load Pull Measurements" [online], Wikipedia [retrieved on Nov. 18, 2016] Retrieved from Internet <URL:http://en.wikipedia.org/wiki/Load_pull>.
"Computer Controlled Microwave Tuner", Product Note 41, Focus Microwaves, Jan. 1998.
Linear Actuator [online], Wikipedia [retrieved on Apr. 25, 2020 ] Retrieved from Internet <URL: https://en.wikipedia.org/wiki/Linear_actuator>.
"Lecture 20: Transmission (ABCD) Matrix" [online], EE 481/581—Microwave Engineering, Course Syllabus [retrieved on Jul. 13, 2015] Retrieved from Internet <URL: http://whites.sdsmt.edu/classes/ee481/notes/481Lecture20>.
"Automatic Load Contour Mapping for Microwave Power Transistors" IEEE transactions on MTT, vol. 22, No. 12, Dec. 1974, pp. 1146-1152.
"Barium Titanate (BaTiO3)", Handbook of Optical Constants of Solids, vol. 2, 1998, pp. 789-803.

(Continued)

*Primary Examiner* — Akm Zakaria

(57) ABSTRACT

Toroidal high dielectric ceramic microwave tuning probes are sliding on the central conductor of a high power electro-mechanical microwave dual-probe coaxial load pull tuner and create high reflection factor over a wide frequency range. The probes are positioned horizontally using a remote translation mechanism and allow continuous coverage of the Smith chart over a high frequency and VSWR (reflection factor) range. A remotely adjustable attenuator is inserted adjacent to the test port and mitigates spurious high reflection. A de-embedding calibration allows full tuner characterization in a few minutes instead of several hours.

5 Claims, 12 Drawing Sheets

(56) References Cited

OTHER PUBLICATIONS

"A Computer-Controlled Microwave Tuner for Automated Load Pull", Sechi F, et al., RCA Review, vol. 44 , Dec. 1983, pp. 566-583, figure 5.
"What is a Vector Network Analyzer and how does it work?" [online], Tektronix [retrieved on Jun. 10, 2020] Retrieved from Internet < https://www.tek.com/document/primer/what-vector-network-analyzer-and-how-does-it-work>.

* cited by examiner

HIGH POWER DUAL PROBE TUNER AND METHOD

PRIORITY CLAIM

Not Applicable

CROSS-REFERENCE TO RELATED ARTICLES

1. "Load Pull Measurements" [online], Wikipedia [retrieved on 11/18/2016] Retrieved from Internet <URL:http://en.wikipedia.org/wiki/Load_pull>.
2. "Computer Controlled Microwave Tuner—CCMT", Product Note 41, Focus Microwaves January 1998.
3. Simpson et al. U.S. Pat. No. 5,910,754, "Reduced Height Waveguide Tuner for Impedance Matching", FIG. 8.
4. "Automatic Load Contour Mapping for Microwave Power Transistors" IEEE transactions on MTT, Vol.-22, No 12, December 1974, pp. 1146-1152.
5. "Barium Titanate ($BaTiO_3$)", Handbook of Optical Constants of Solids, Volume 2, 1998, pages 789-803.
6. Tsironis C., U.S. Pat. No. 9,625,556, "Method for Calibration and Tuning with Impedance Tuners".
7. "Two-port Gain and Stability", Niknejad, University of California, Berkley, page 15 of 32.
8. Linear Actuator [online], Wikipedia [retrieved on 04/25/2020] Retrieved from Internet <URL:https://en.wikipedia.org/wiki/Linear_actuator>
9. "A Computer-Controlled Microwave Tuner for Automated Load Pull", Sechi F, et al., RCA Review, Vol 44, December 1983, pp. 566-583, FIG. 5.
10. "Lecture 20: Transmission (ABCD) Matrix" [online], EE 481/581—Microwave Engineering, Course Syllabus [retrieved on 07/13/2015] Retrieved from Internet <URL: http://whites.sdsmt.edu/classes/ee481/notes/481Lecture20>
11. Tsironis C., U.S. Pat. No. 9,666,928, "High power slide screw tuners", FIGS. 10 and 12.
12. "What is a Vector Network Analyzer and how does it work?" [online], Tektronix [retrieved on 06/10/2020] Retrieved from Internet <https://www.tek.com/document/primer/what-vector-network-analyzer-and-how-does-it-work>.

BACKGROUND OF THE INVENTION

This invention relates to RF load and source pull testing of medium and high power RF transistors and amplifiers using remote controlled electro-mechanical impedance tuners.

A popular method for testing and characterizing such microwave components (transistors) in the non-linear region of operation is "load pull" (see ref. 1). Load pull is a RF device measurement technique employing microwave impedance tuners and other microwave test equipment as shown in FIG. 1. The microwave tuners 2, 4 (see ref. 2) are used in order to manipulate the microwave impedance conditions under which the Device Under Test (DUT, or transistor, 3) is tested; the test signal is provided by a signal source 1 and the out-coming power is measured by a power meter 5; the whole is controlled by a PC controller 6, which comprises electronic interface to communicate with the instruments 1, 5 and the tuners 2, 4 using digital control and communication cables 7, 8 and 9.

DESCRIPTION OF PRIOR ART

Two-probe impedance tuners comprise, in general, a low loss transmission line 30 (slabline), FIG. 3, and two conductive tuning elements (tuning probes, 31, 32 and FIG. 2); the probes 21 are attached 22 on complex adjustable high precision vertical axes 33, 34 (see ref. 3) and are inserted 26 into the slabline 24, approaching very closely the center conductor 23 and moved 25 along the axis of the slabline; this movement of the tuning probes creates a controllable variable reactance, allowing the synthesis of various impedances (or reflection factors) covering large parts, up to the quasi totality, of the Smith chart (the polar impedance mapping display showing the normalized reflection factor area). The relation between reflection factor Γ and impedance Z is given by $\Gamma=(Z-Zo)/(Z+Zo)$, where $Z=R+jX$ and Zo is the characteristic impedance. A typical value used for Zo is 50 Ω.

Parallelepiped metallic tuning probes (slugs) 21, FIG. 2, must be positioned within micrometers from the center conductor to create acceptable high reflection (high tuning range); this creates electrical sparking risk at high power. Also, it creates extreme demand on the precision of the vertical axis mechanism. These two shortcomings can be countered when using dual probe tuners in a coaxial environment, as first proposed by Cusack (see ref. 4); additionally, if the toroid tuning probes are made using high dielectric permittivity (εr) material, like Barium Titanate (see ref. 5), then sparking risk is quasi eliminated. However prior art regarding such tuners does not teach a generic wideband calibration method (see ref. 6) or a design providing wideband nearly 50 Ω neutral state (see in ref. 4, FIG. 6a). Both the calibration and a wideband 50 Ω neutral state for dual probe tuners are disclosed in this invention.

BRIEF SUMMARY OF THE INVENTION

The invention claims a load pull tuner system using a new, high power, tuner type. The structure is different from prior art slide screw single and two probe tuners (ref. 2, 4 and 9 and FIG. 3), because it uses horizontal-only high-speed tuning probe movement (as ref. 4 and 9) but, in addition a) an adjustable attenuator to mitigate the disadvantageous residual spurious reflection of the tuner in ref. 4 and 9 as well as b) a new fast de-embedding calibration method, which in ref. 9 was substituted by an inaccurate numerical model. Once the tuner is properly calibrated, prior art impedance synthesis (tuning) methods are applicable (see ref. 6).

The tuner itself uses a slotted, low loss, coaxial airline, (FIG. 5), in order to allow simple manufacturing and alignment for high power tuning. The main power handling problem of traditional slide screw tuners, as shown in FIG. 3, using tuning probes as shown in FIG. 2, is that, under high power conditions, the long thin center conductor, which is entirely suspended and thermally isolated, heats up and, since it cannot expand freely between the two coaxial connectors, sags and makes contact with the close-by tuning probe, creating a destructive electrical short. On the other hand the major advantage of the prior art slide screw tuner of FIG. 3, compared with Cusack's dual probe tuner of ref. 4 and 9, is that the slide screw tuner has a wideband 50 Ω neutral state when all tuning probes are withdrawn, whereas this is impossible to achieve with the dual probe tuner of ref. 4 and 9, since the toroid probes are always engaged and cannot be withdrawn. The dual probe tuner of ref. 4 and 9 has no neutral state. 50 Ω, instead, is an impedance to be tuned to for each individual frequency as it is shown in FIG. 9A when there is no attenuator included. This is a major handicap when connecting such tuners to any potentially unstable (see ref. 7) active DUT (transistor), which may oscillate spontaneously at any frequency where random high reflection factors (see FIGS. 9A and 9B) are presented and the oscillation conditions are satisfied. The carriages attached to the toroid tuning probes are controlled using high-speed electric stepper actuators 64, 65 (see ref. 8) thus eliminating also additional control gear beyond a simple ACME lead screw 63. Last, not least, the tuning mechanism, liberated from cumbersome and expensive high-resolution vertical probe control and movement delays, benefits also from inherent lower tuning error sensitivity to mechanical probe positioning tolerances close to $|\Gamma|\approx 1$.

To eliminate this remaining handicap of prior art, dual probe tuners (ref. 4, 9) the tuner described in this invention includes, in addition to the two horizontally movable toroid probes T1 and T2, also a vertically adjustable absorbing probe 68, inserted close to the test port 60 and before the first toroid probe T1. This absorbing probe has fixed horizontal position and is inserted between a full withdrawal and full insertion into the same slot 66 or an additional slot in the mantle of the coaxial airline. At full withdrawal the absorbing probe (typically a ferromagnetic sliver, FIG. 8) has no effect on the transmission behavior of the tuner and, at maximum insertion, it creates insertion loss and reduces the wideband reflection of the toroid tuning probes (FIG. 9); the absorbing probe is controlled remotely using a stepper motor 62, 81. Control of the proximity 67 or d is either using a simple vertical axis or the eccentric rotation of a disc-formed absorbing probe 68, 83 around the motor axis, 82, 61.

The effect of this additional absorbing probe is to limit the always present undesired peaks in reflection factor over a large frequency bandwidth (FIG. 9A), created by the always engaged toroid probes at any of their individual positions. This attenuator eliminates the risk of undesired spurious oscillations. The built-in adjustability of the created attenuation allows searching for an optimum tuning compromise between spurious oscillations and maximum reflection factor. Any other solution would require adjustable absorbing band-pass filters, a quasi unfeasible task.

BRIEF DESCRIPTION OF THE SEVERAL VIEWS OF THE DRAWINGS

The invention and its mode of operation will be more clearly understood from the following detailed description when read with the appended drawings in which:

FIG. 9A depicts amplitude or reflection factor for shallow insertion of attenuator; FIG. 9B depicts effect of more insertion of attenuator and FIG. 9C depicts maximum insertion.

DETAILED DESCRIPTION OF THE INVENTION

Figure 4:
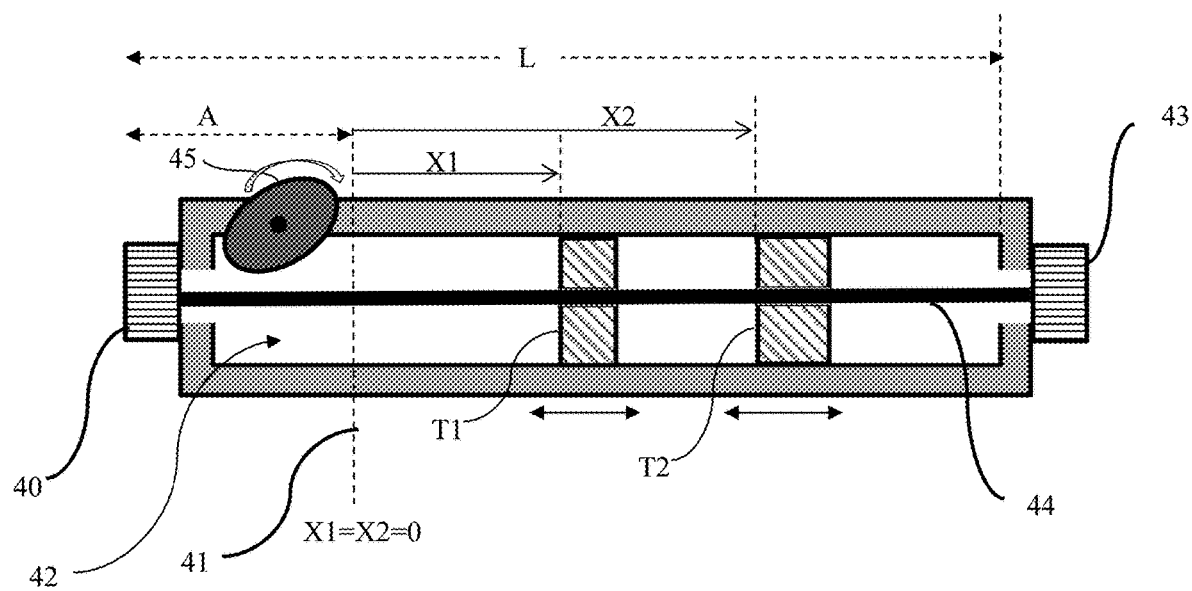
FIG. 4 depicts a dual toroid tuning probe tuner with adjustable attenuation section.
Figure 10:
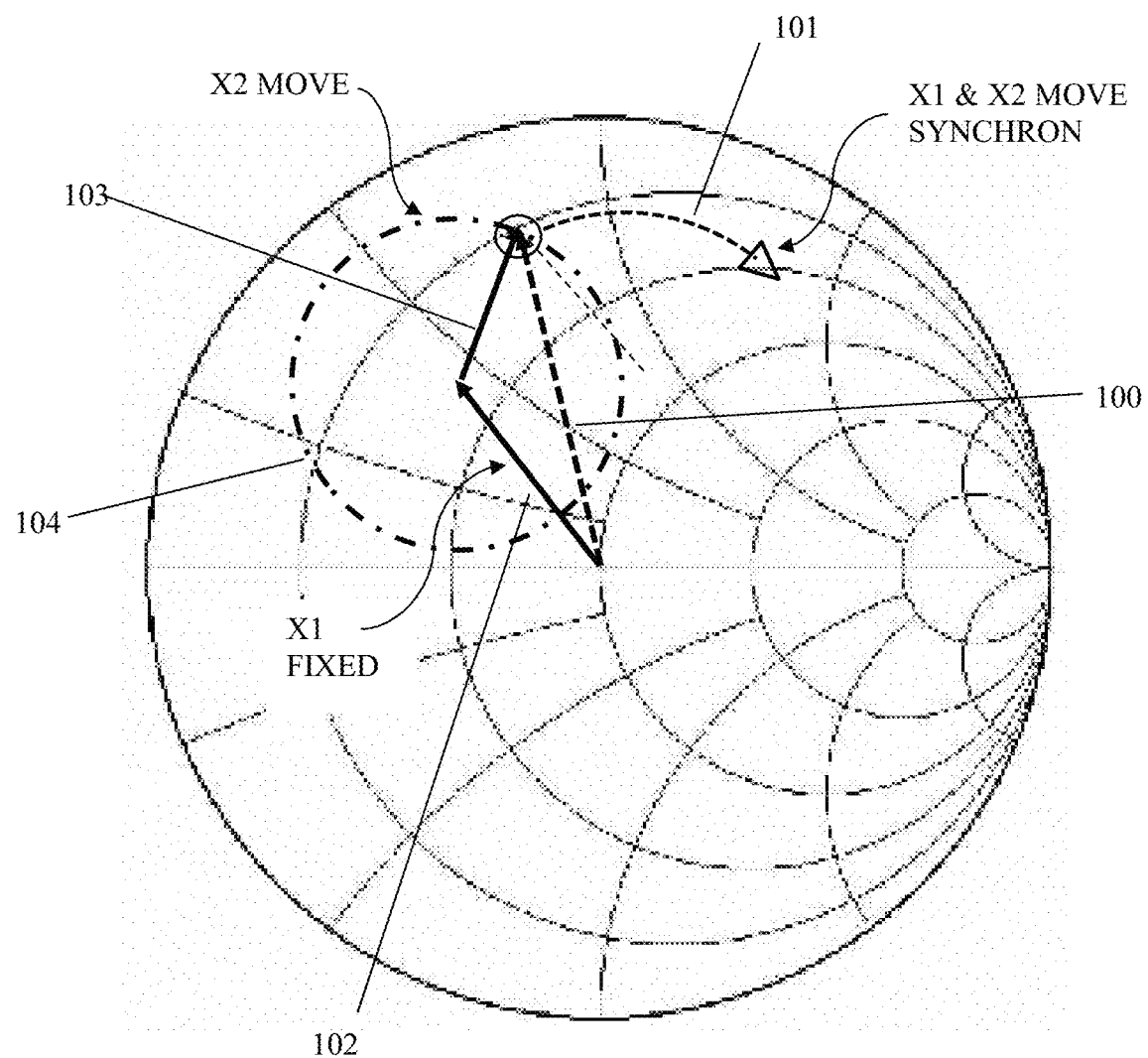
FIG. 10 depicts tuning mechanism of dual toroid tuning probe tuner.

This invention discloses a radio frequency (RF, microwave), computer-controlled impedance tuning system, suitable for load pull measurements, comprising at least one electro-mechanical impedance tuner and the calibration method thereof. The tuner (FIGS. 4 to 6) uses a low loss coaxial transmission airline 42, which includes a cylindrical center conductor 44. The center conductor terminates at the two ends of the airline, the test port 40 facing the DUT, and the idle port 43 facing the load. Two toroid (donut-formed) tuning probes T1 and T2 are inserted next to each-other and slide on the center conductor. They can be moved only horizontally along the airline; each probe creates at its own reference plane concentric reflection factor circles 102, 104 on the Smith chart (FIG. 10). The total reflection factor T, 100 presented by the tuner to the DUT at the test port 40, 60 is created by the superposition of the two reflection factor vectors and can be seen in FIG. 10.

Figure 1:
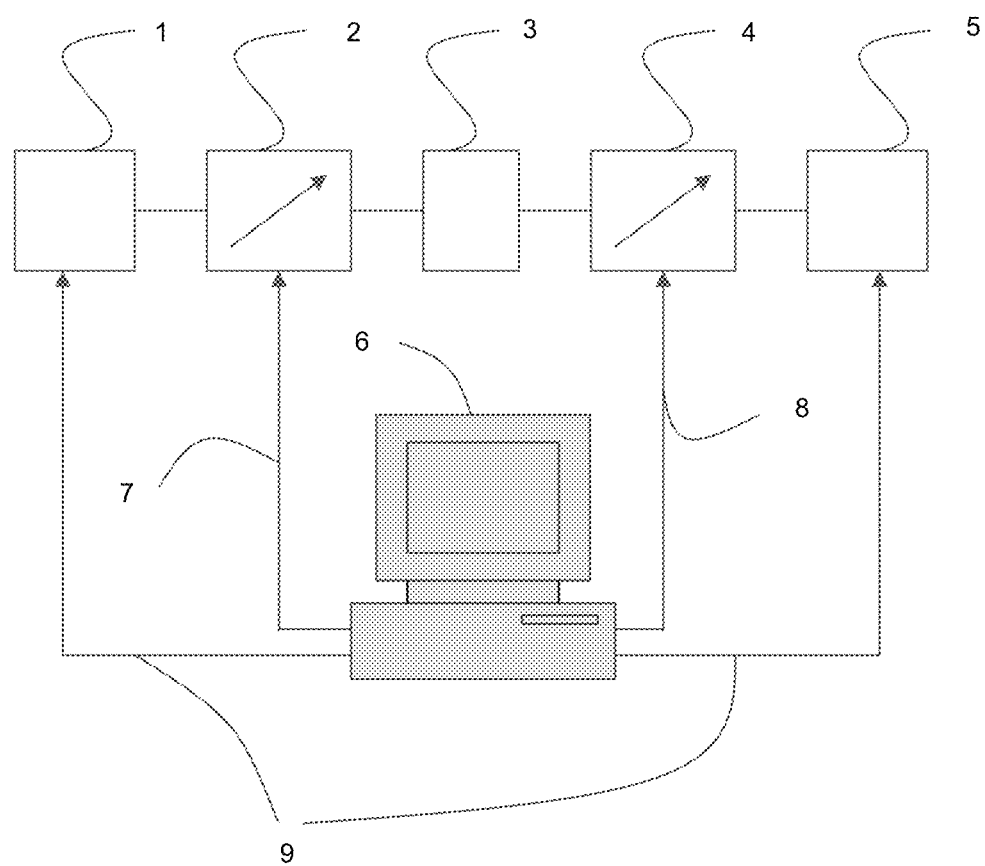
FIG. 1 depicts prior art: a typical automated load pull test system.
Figure 2:
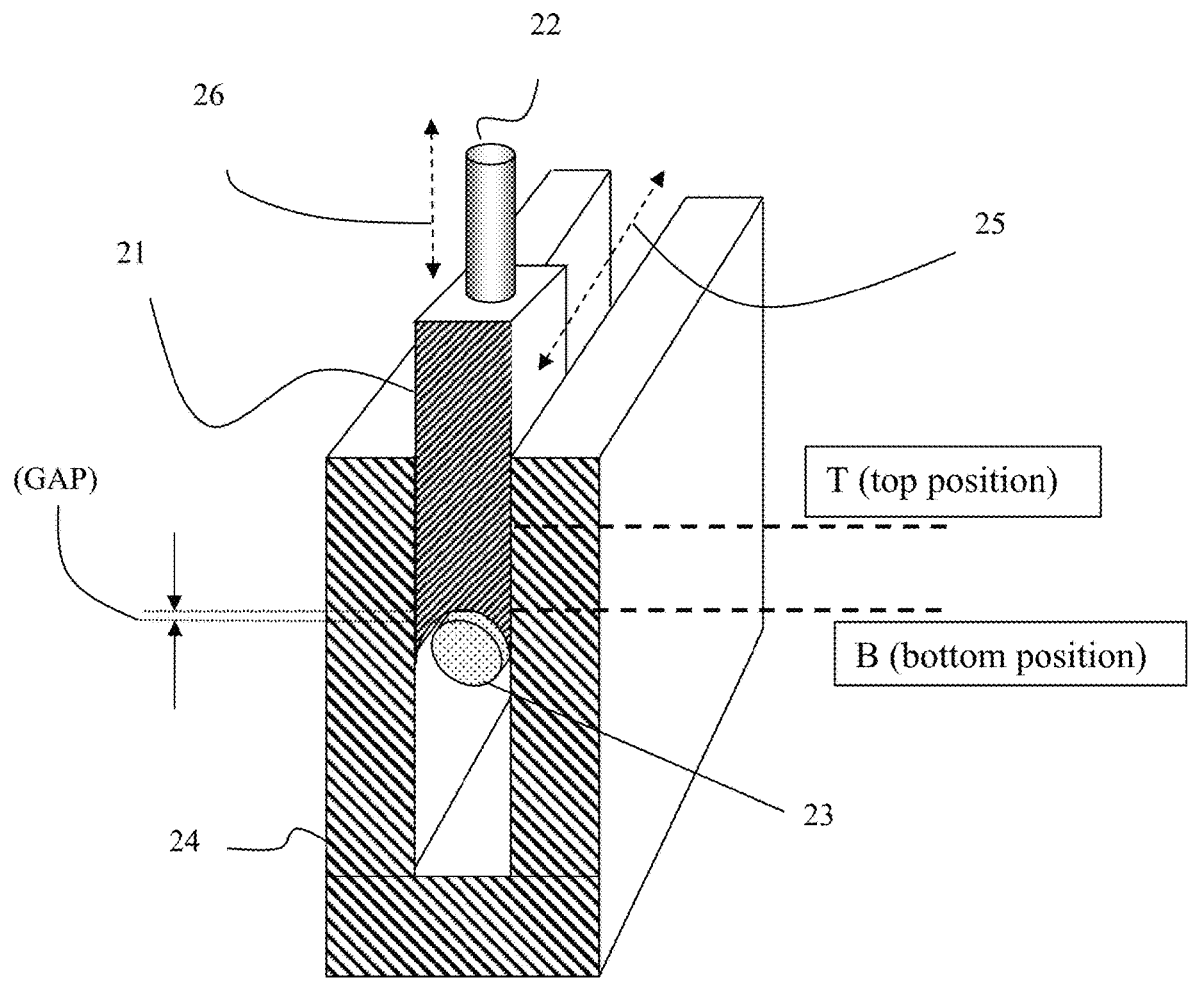
FIG. 2 depicts prior art: a perspective view of a capacitively coupled, vertically adjustable RF parallelepiped tuning probe (slug) and the relevant dimensions and parameters of the operation.
Figure 3:
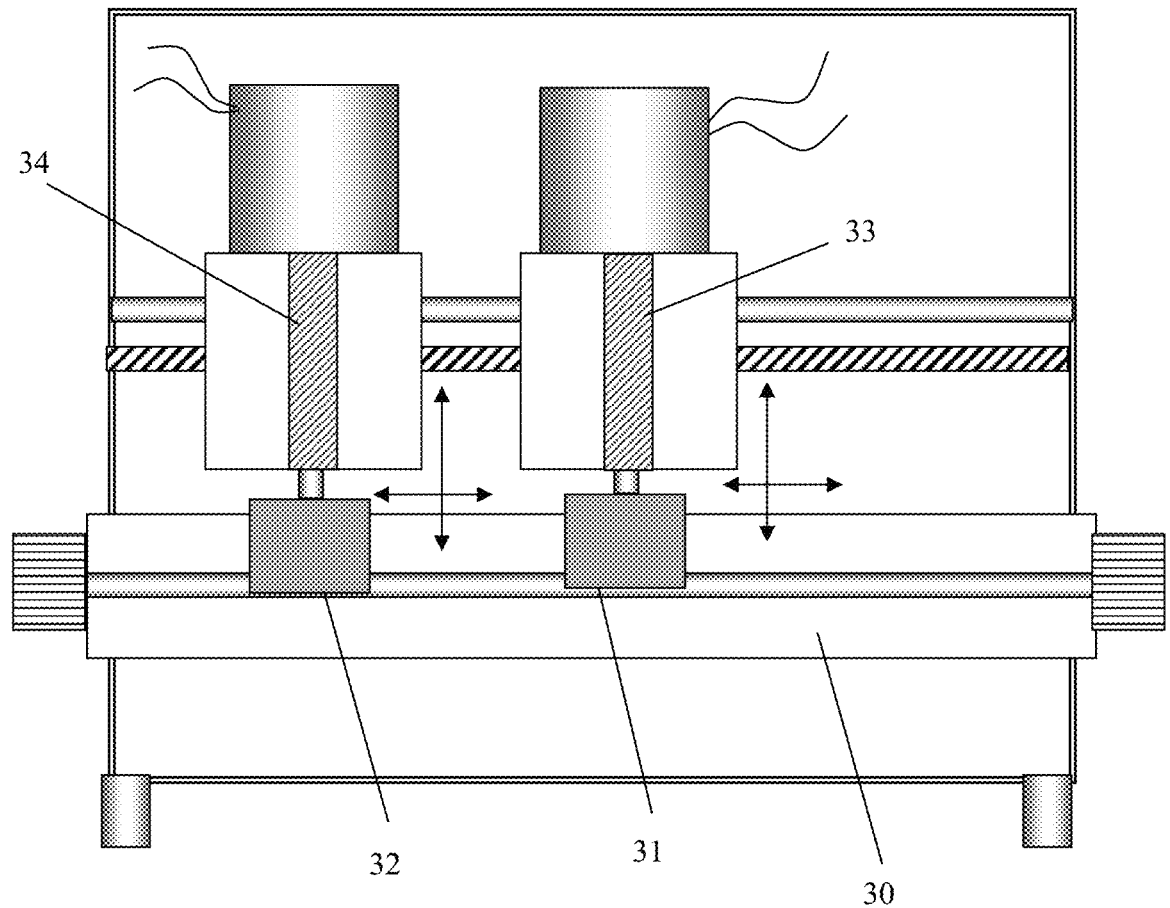
FIG. 3 depicts prior art: front view of a two-carriage/two-probe slide screw tuner.

The horizontal control of the probes in the airline 42 is best accomplished using linear electric actuators (see ref. 8). These have a motorized body 64, 65 and their motor axis is an associated horizontal ACME screw 63. Since the tuner does not have adjustable vertical axis, not being able to withdraw the tuning probes from the airline, eliminates the possibility of a wideband 50 Ω neutral state. This is then accomplished using the adjustable attenuation section 61, 62, 68. In fact, from tuning range point of view the tuner behavior of this invention does not behave differently than the prior art tuner of FIG. 3 for testing potentially unstable transistors. In both cases the allowable reflection factor range is limited in order to stay outside the instability circle (see ref. 7), whether this happens by inserting the attenuator in the dual probe tuner, or by partly withdrawing the tuning probe of the slide-screw tuner, to avoid crossing into the instability range of the transistor, is irrelevant. For maximum tuning range the attenuator of the dual probe tuner can be fully withdrawn. The mobile toroid probes T1 and T2 (FIG. 4) slide on the center conductor 44 along the airline and cover 360° reflection factor at the lowest frequency of operation Fmin when moving up to λ/2 each. The total length L of the airline is at least one wavelength λ(Fmin) at the minimum operation frequency (Fmin) plus the thickness of the probes T1+T2 plus the width A of the attenuation section: L=A+T1+T2+λ(Fmin).

At the lowest frequency, thus, the whole length of the airline is engaged. At higher frequencies the tuning toroids T1 and T2 operate closer to the test port 40. The relative starting position 41 is defined by the manufacturing method and shall be as close as possible to the test port 40, as the movement of the absorbing attenuator 45 allows. The width of the attenuation section is defined as A. The tuner is connected to the DUT at port 40 and to the following instruments at the idle port 43.

Figure 5:
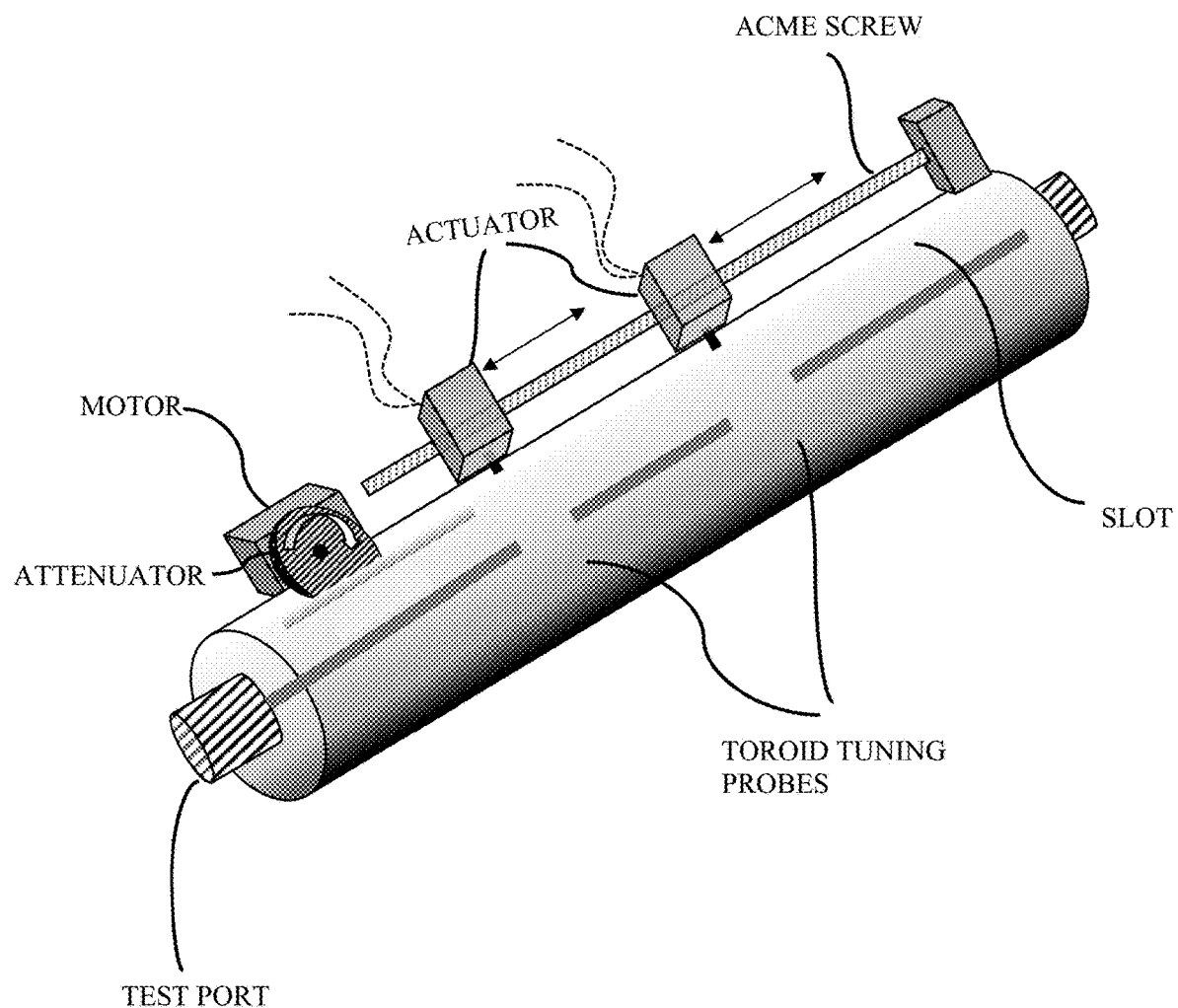
FIG. 5 depicts perspective 3D view of dual toroid tuning probe tuner with adjustable attenuation section.
Figure 6:
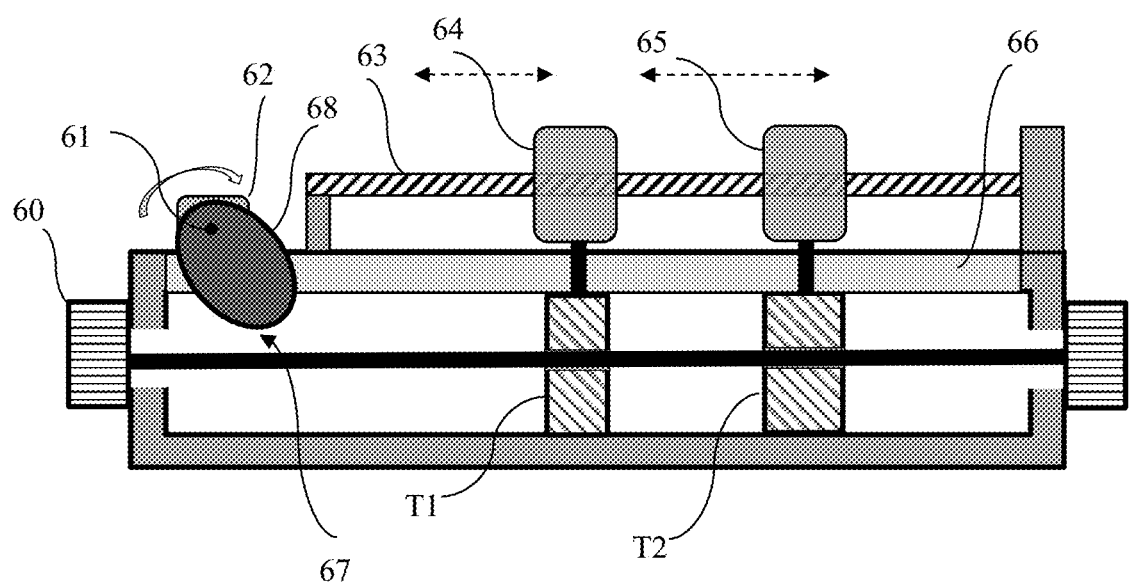
FIG. 6 depicts dual toroid tuning probe tuner with adjustable attenuation section and control mechanism.

FIG. 5 shows a perspective view of the tuner. The two actuators move along the ACME screw and carry the toroid tuning probes along. The attenuator disc is rotated by the third motor 45, 81 in and out of the slot setting the insertion loss. Reflection factor generation is shown in FIG. 10:

Assuming probe T1 is closer to the test port, it generates a (fixed) vector 102; probe T2 creates a superimposed vector 103 which rotates, when probe T2 moves, around the tip of vector 102, following the trajectory 104 and creates a total vector 100. If only probe T2 moves, then the total vector 100 follows trace 104; when both probes move together at the same pace, then the total vector 100 follows trace 101 and if they both move at different paces it follows a 8 shaped contour (see ref. 9).

Figure 9A:
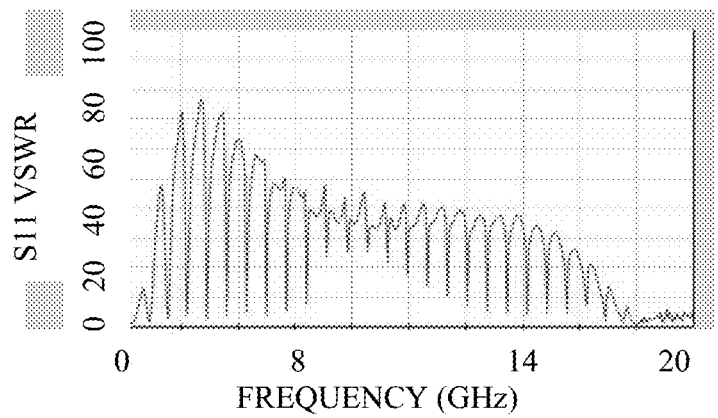
FIG. 9A through 9C depict wideband reflection factor of dual probe tuner.
Figure 9B:
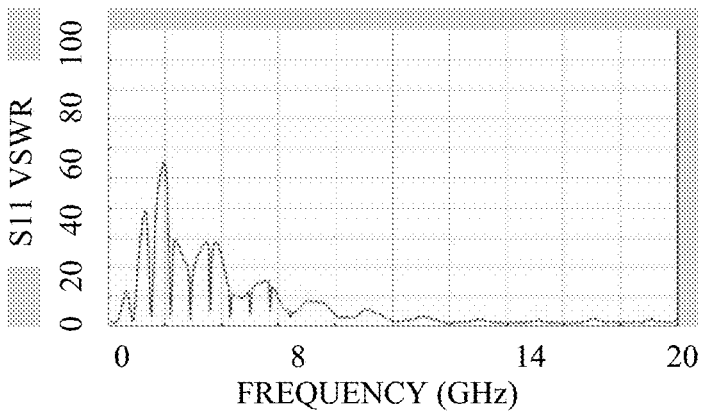
Figure 9C:
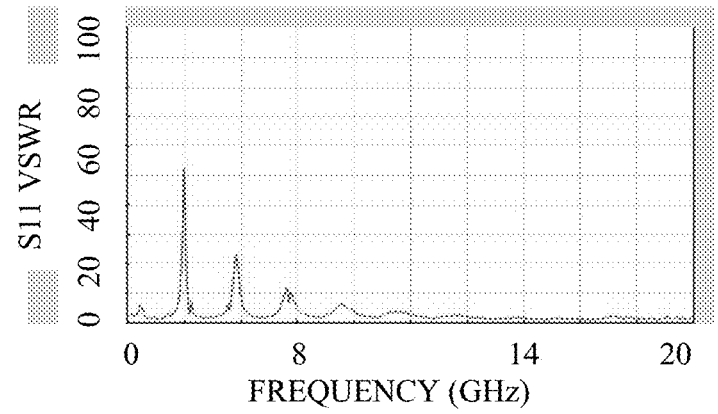

The novelty of the tuner in this invention is the addition of the adjustable attenuation section A (61, 62, 68) between the test port and the first tuning probe T1. This is necessary because the dual probe tuner does not have a low reflection neutral state. At any position of the tuning toroids there is a multitude of frequencies with peak reflection factor (FIG. 9A) and uncontrollable phase. FIGS. 9B and 9C show the gradual quenching of the uncontrollable native wideband reflections of this type of tuner, that risk creating spurious oscillations; connecting a potential unstable transistor with Linvill stability factor K<1 (see ref. 7) is almost certain to cause spurious oscillations, impossibility to carry out measurements and, often, destruction of the power transistor. This must be avoided; else the tuner is of limited only use.

Figure 7:
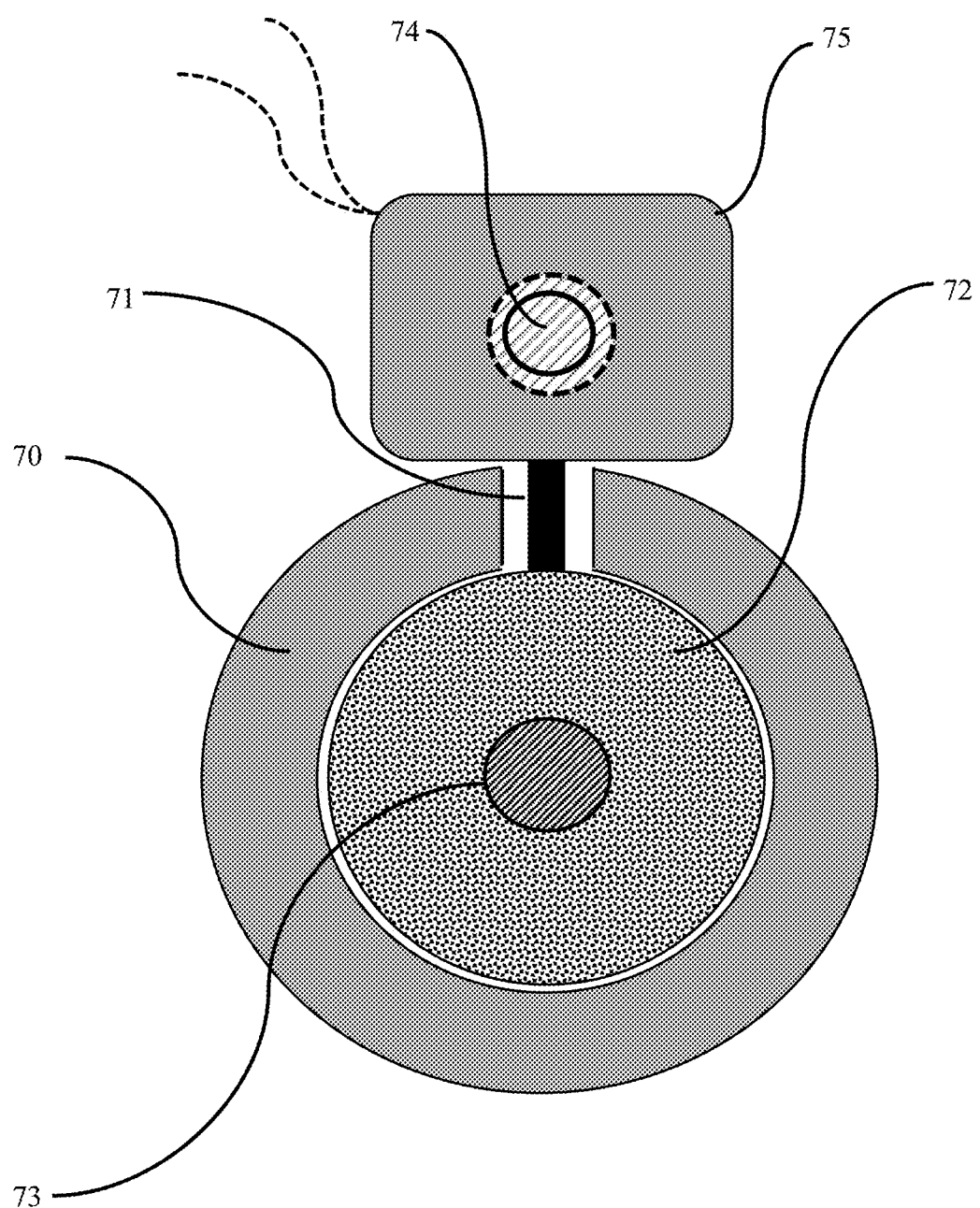
FIG. 7 depicts cross section of toroid tuning probe and remote control.

The toroid tuning probe is shown, in cross section in FIG. 7: The core 72 of the toroid is made using dielectric material, preferably ceramic, as being more resistant to high temperatures. Such material can be Alumina $Al_2O_3$ with a dielectric coefficient εr around 9 or other sitred material such as Barium Titanate $BaTiO_3$ with εr varying from 40 to 100 depending on frequency. The exact type and dielectric coefficient of the material used is not critical. The toroid cylinders have an internal hole diameter 73 allowing sliding on the center conductor and external diameter slightly smaller than the cylindrical tube of the airline 70, allowing free travel and even some small expansion in case of heating. The toroids are attached 71 with the actuator (motor) 75 which travels, remotely controlled on the ACME screw 74. The hard ceramic material slides and rubs over the center conductor, i.e. gold or another surface plating is inappropriate. The center conductor must be made of massive high conductivity metal, such as copper or silver and must include thermal expansion capacity, like sliding expansion slots (see ref. 11).

Figure 8:
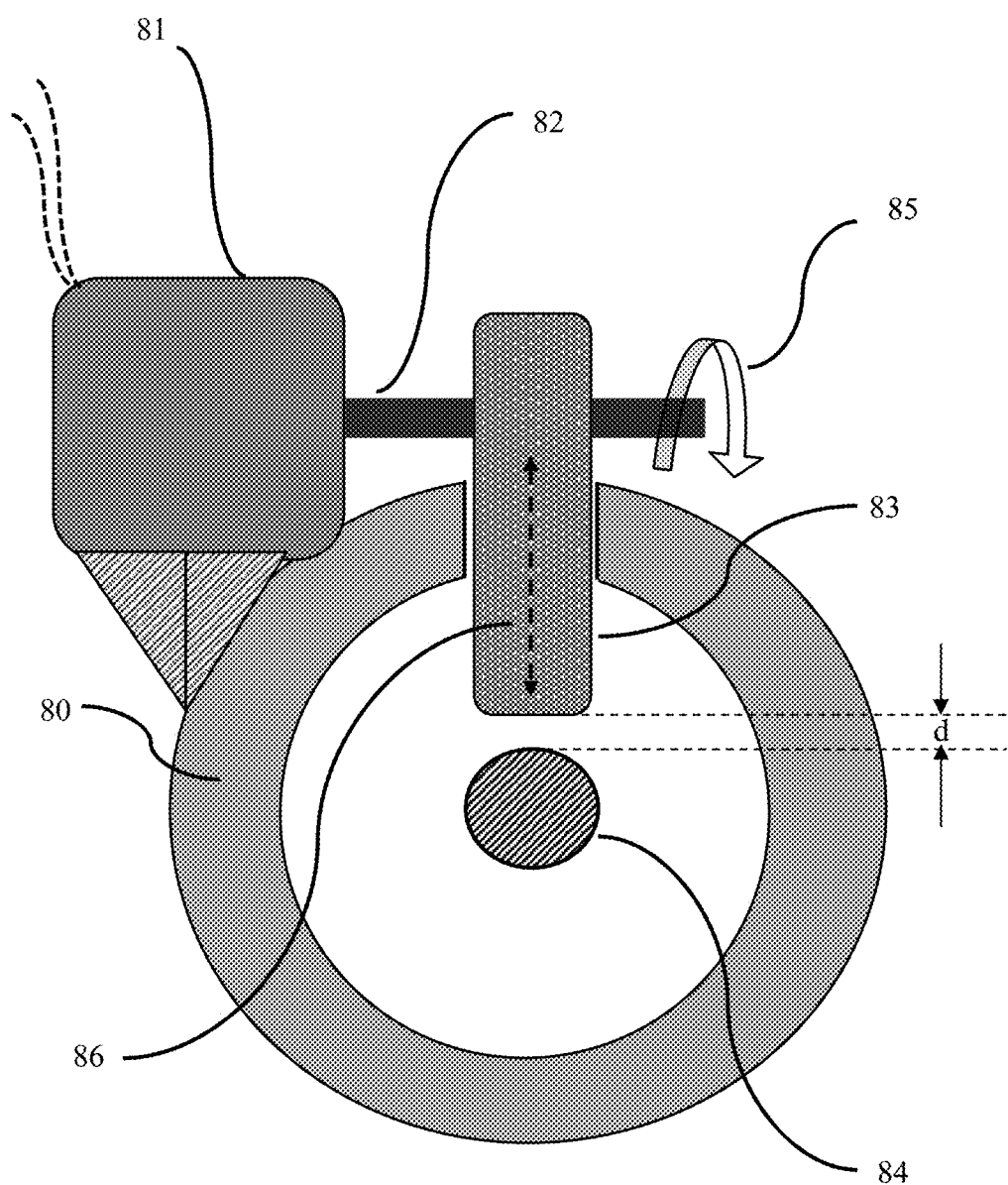
FIG. 8 depicts cross section of adjustable attenuator and remote control.

The adjustable attenuator is shown in cross section in FIG. 8: The absorbing sliver 83 is preferably made of ferromagnetic material to interrupt the magnetic field around the center conductor 84 and the wave propagation. The stepper motor 81 rotates 85 eccentrically 61 the absorbing sliver, which is attached to its rotating axis 82 thus controlling 86 the distance d, 67 between the ferrite and the center conductor and this way the attenuation. The motor 81 is firmly attached to the airline mantle 80 and does not move. The structure represents an efficient method for in situ attenuation control.

Other than using inaccurate theoretical models (see ref. 9), the tuner is calibrated experimentally with much higher accuracy, but it usually takes longer time if all probe setting combinations have to be measured. The calibration disclosed in this invention is extremely fast and executes in two main steps: in a first "configuration" action we choose the number P of required attenuation levels Ai. Typically, three or four levels of attenuation shall suffice. In a second action s-parameters are measured and processed. Herein a first step consists of totally removing the attenuation by withdrawing the absorbing device from the airline. In this case the reflection will be maximum at a number of frequencies, independently on the position of the tuning probes, and this creates inherent risk of DUT spurious oscillations. A second step consists of inserting the absorbing device 83 (FIG. 8) moderately into the airline opening, such as to create a 3 dB insertion attenuation, resulting in approximately 6 dB return loss or a maximum reflection factor of 0.5; in a next step the absorbing device is inserted further creating an attenuation of 6 dB or 12 dB return loss or maximum reflection factor of 0.25. In a last step the absorbing device is fully inserted into the airline creating an attenuation of at least 10 dB, or return loss of 20 dB and maximum reflection of 0.1; it is presumed that such low reflection shall be safe for the DUT regarding spurious oscillations.

Figure 11:
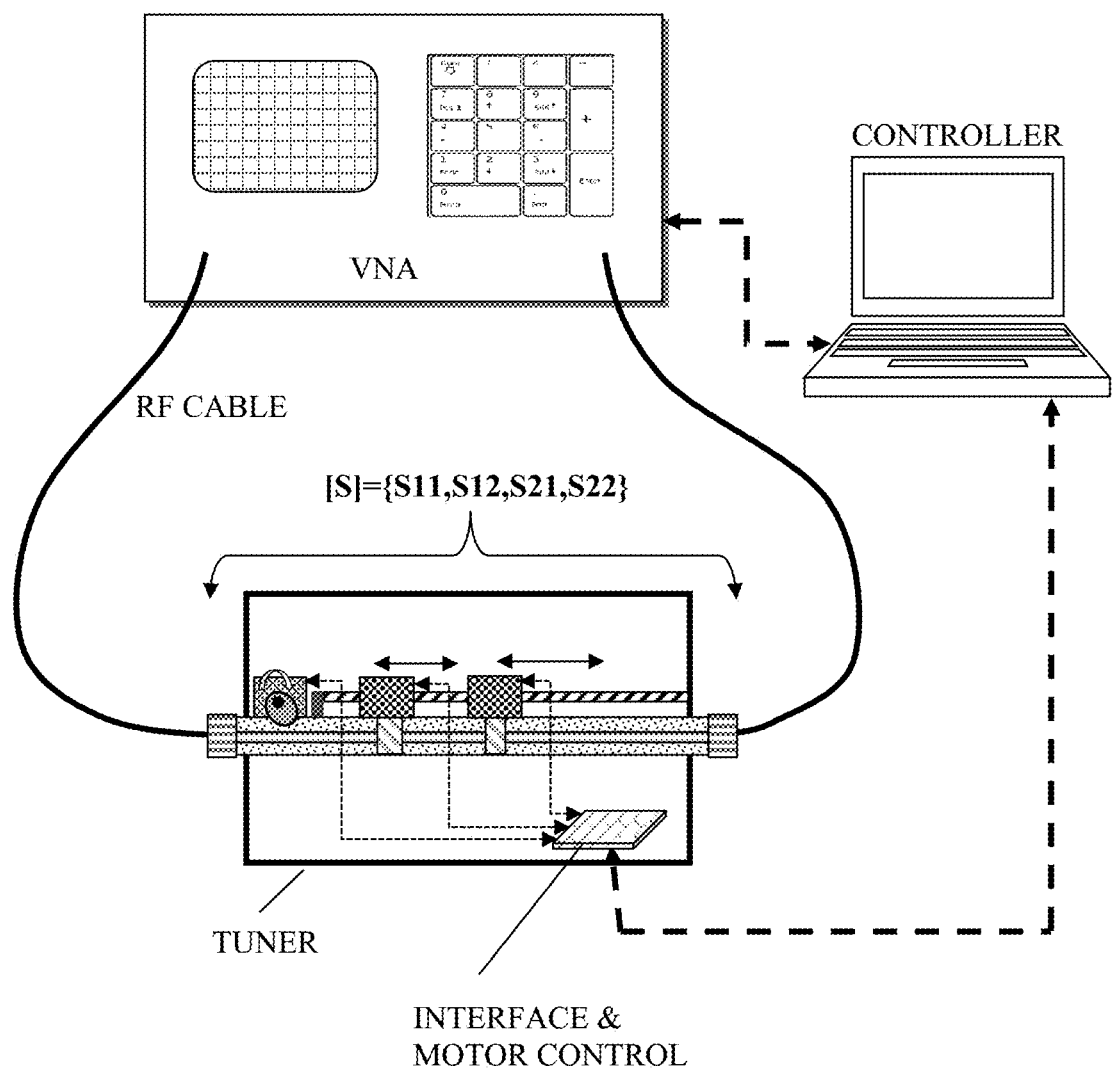
FIG. 11 depicts calibration setup of the tuner.
Figure 12:
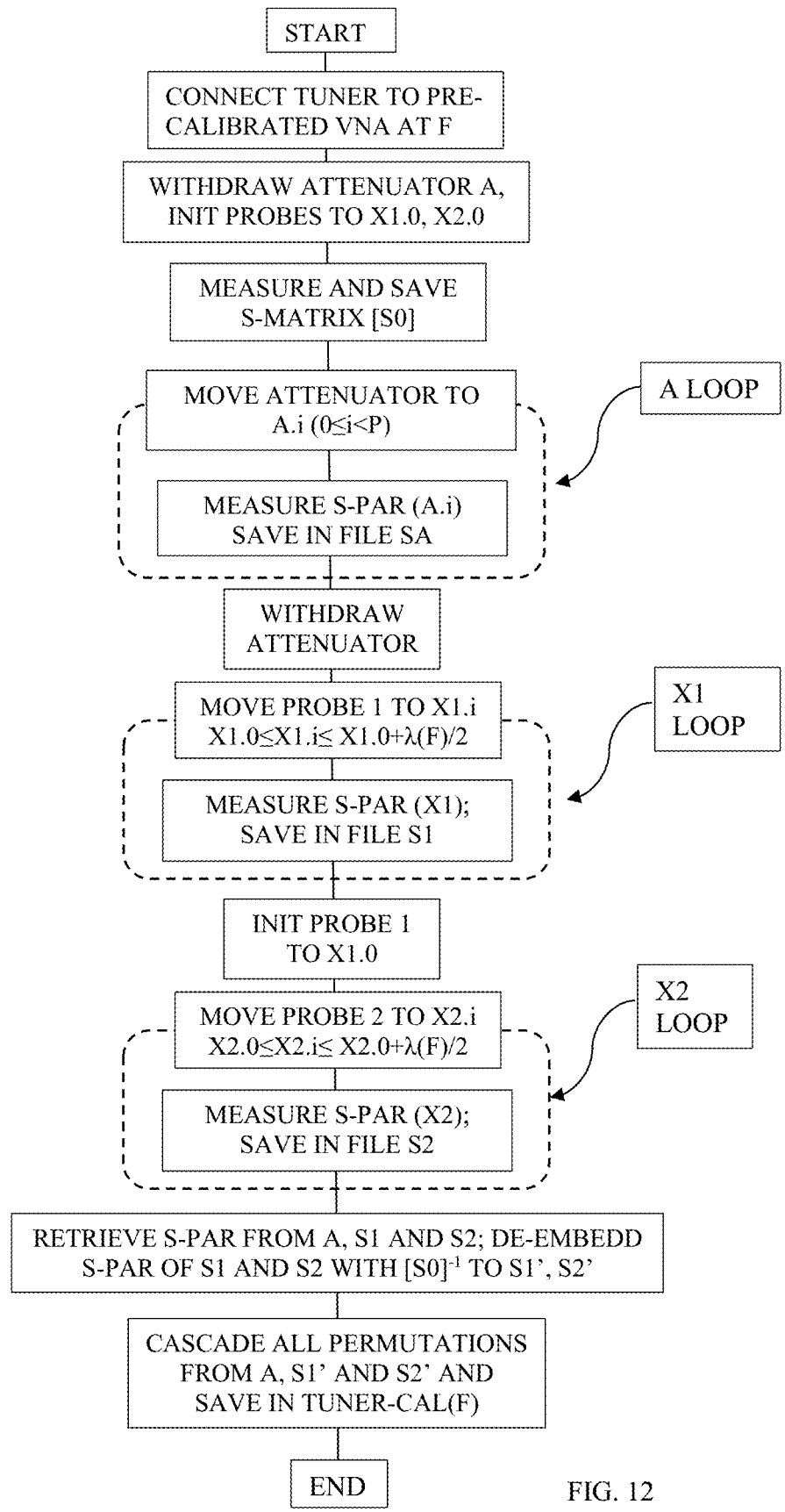
FIG. 12 depicts flowchart of the de-embedding calibration algorithm of the dual toroid tuning probe tuner with adjustable attenuator.

The actual tuner calibration (FIG. 12) proceeds in connecting (FIG. 11) the tuner to a pre-calibrated vector network analyzer (VNA) (see ref. 12) measuring scattering (s-) parameters of the tuner between the test and idle ports for a multitude of tuning probe positions, de-embedding, matrix cascading and saving as follows: (a) for each of the attenuator settings Ai for i=0,1,2,3 . . . up to the number i=P of attenuator settings described in the previous paragraph, the tuning probes are initialized, i.e. they are placed at certain horizontal positions X1.0 and X2.0; for all operation frequencies X1.0 is always the same, i.e. as close to the test port, as the attenuation section physically allows, and X2.0 is variable, one half a wavelength, plus the thickness of the first tuning probe away from X1.0: X2.0=X1.0+T1+λ(F)/2; then the initialization matrix [S0] is measured and saved; in a second step, (b), s-parameters are measured for each of the P settings A.i, while tuning probes 1 and 2 remain at X1=X1.0 and X2=X2.0, and saved in file SA, yielding P s-parameter matrices [S(A.i,X1.0,X2.0)]; in a third step (c) s-parameters are measured for A=A.0, X2=X2.0 and a multitude N of X1 positions X1.i of tuning probe 1, while the attenuator is set to A.0 and tuning probe 2 remains at position X2.0, and saved, yielding s-parameter matrices [S(A.0,X1.i,X2.0)]; in step (d) the roles of tuning probes 1 and 2 are swapped: s-parameters are measured for the M positions X2 of tuning probe 2, while the attenuator remains at A.0 and tuning probe 1 is returned and remains to X1.0, and saved, yielding s-parameter matrices [S(A.0,X1.0, X2.i)]; this procedure requires P+N+M total tuner settings and s-parameter measurements. Forthwith any short-form mention of s-parameter cascading, de-embedding etc. is meant to be numerically executed using the transmission (ABCD) format of the s-parameters. In a last step (e) measured s-parameter matrices of the total tuning permutations P*N*M are converted to ABCD matrices (see ref. 10), de-embedded (i.e. multiply with the inverse) with the ABCD (transmission parameter) version of the initialization matrix [S0], cascaded, converted back to s-parameters and saved in a total calibration matrix for all the selected frequencies. De-embedding is executed as follows: Total tuner matrix ST(A.i,X1.j,X2.k)=[S(Ai,X1.0,X2.0)]*[S0]-1*[S(A.0, X1.j,X2.0)]*[S0]$^{-1}$*[S(A.0,X1.0,X2.k)]; wherein 0≤i<P, 0≤j<N, 0≤k<M. The de-embedding calibration saves a large amount of time DT=DM*(P−1)*(M−1)*(N−1); as an example for a typical individual probe positioning and measurement delay DM=3 sec., a total of P=4 attenuation settings and N=M=50 probe positionings, the calibration time is reduced from 8.33 hours to 5.2 minutes.

Obvious alternatives to the disclosed concept of a load pull system using a tuner with two independent lateral-only toroid tuning probes and pre-positioned adjustable attenuator and the associated calibration method shall not impede on to the validity of the present invention.

What is claimed is:

1. A radio frequency (RF) load-pull tuner comprising:

a slotted coaxial airline having a test port, an idle port, a cylindrical center conductor, and two remotely controlled mobile carriages, carriage #1 and carriage #2, both moving along the slotted airline, two dielectric toroid tuning probes, toroid tuning probe #1 and toroid tuning probe #2, having associated thicknesses T1 and T2, traversed axially by the center conductor, riding on the center conductor and sliding inside and along the slotted coaxial airline, and an RF energy-absorbing sliver insertable into the slotted coaxial airline, wherein the carriage #1 controls the toroid tuning probe #1 and carriage #2 controls the toroid tuning probe #2, and wherein the RF energy-absorbing sliver is placed between the test port and the toroid tuning probe which is closest to the test port;

and wherein the carriage #1 positions the toroid tuning probe #1 at a distance X1 from the test port equal or greater than the furthest extension A of the RF energy-absorbing sliver away from the test port, and the carriage #2 positions the toroid tuning probe #2 at a distance X2 from the test port equal or greater than the distance X1 of the toroid tuning probe #1 from the test port plus the thickness T1 of the toroid tuning probe #1.

2. The RF load-pull tuner of claim 1 wherein the toroid tuning probes have an axial hole with a diameter slightly larger than the diameter of the center conductor and external diameter allowing them to move freely inside the coaxial slotted airline.

3. The RF load-pull tuner of claim 1, wherein the airline is at least one wavelength $\lambda$, long, at a minimum frequency of operation Fmin of the load-pull tuner, plus the sum of the thicknesses of the toroid tuning probes #1 and #2 plus the furthest extension A of the RF energy-absorbing sliver away from the test port.

4. The RF load-pull tuner of claim 1, wherein the RF energy-absorbing sliver is remotely insertable into the slotted coaxial airline using a stepper motor and appropriate control gear.

5. The RF load-pull tuner of claim 1 being calibrated as follows:

a) connect the tuner to a vector network analyzer VNA pre-calibrated at an RF frequency F greater or equal to Fmin;

b) withdraw the RF energy-absorbing sliver from the airline to an initial setting A0 and place the toroid tuning probes to initial positions X10 and X20, wherein X10 is equal to the furthest extension A of the RF energy-absorbing sliver away from the test port and X20 is equal to X10 plus one half of a wavelength $\lambda(F)/2$ at a frequency of operation;

c) measure s-parameters Sij for $\{i, j\}=\{1,2\}$ of the load pull tuner and save in a zero matrix [S0];

d) in an RF energy-absorbing sliver positioning and measurement loop, insert the RF energy-absorbing sliver in a multitude of P+1 steps Ak from withdrawal setting A0 to maximum insertion setting AP, where P>0 and $0 \leq k \leq P$) measure s-parameters Sij for $\{i, j\}=\{1,2\}$ of the tuner and save in a file comprising s-parameter matrices [SA]=[S(Ak, X10, X20)] a function of RF energy-absorbing sliver penetration Ak between settings A0 and AP with both toroid tuning probes initialized;

e) withdraw the RF energy-absorbing sliver to the withdrawal setting A0;

f) in a toroid tuning probe #1 positioning measurement loop, move toroid tuning probe #1 in a multitude of M+1 steps X1i from the position X10 to a position X1MAX equal to X10 plus one half of a wavelength $\lambda/2(F)$, where M>1 and $0 \leq i \leq M$, measure s-parameters of the tuner and save in a file comprising matrices [S1]=[S(A0, X1i, X20)], a s-parameter function of X1 at the withdrawal setting A0 of the RF energy-absorbing sliver and the initial setting X20 of the toroid tuning probe #2;

g) move the toroid tuning probe #1 to the initial position X10;

h) in a toroid tuning probe #2 positioning measurement loop, move toroid tuning probe #2 in a multitude of N+1 steps X2j from the position X20 to a position X2MAX equal to X1MAX plus one half of a wavelength $\lambda/2(F)$, where N>1 and $0 \leq j \leq N$, measure s-parameters of the tuner and save in a file comprising s-parameter matrices [S2]=[S (A0, X10, X2j)] a s-parameter function of X2 at the withdrawal setting A0 of the RF energy-absorbing sliver and the initial setting X10 of the toroid tuning probe #1;

i) cascade the inverse matrix $[S0]^{-1}$ with the matrices [S1] and save as matrices [S1E];

j) cascade the inverse matrix $[S0]^{-1}$ with the matrices [S2] and save as matrices [S2E];

k) cascade all permutations (P+1)*(N+1)*(M+1) of the s-parameter matrices [SA], [S1E] and [S2E] and save in a tuner s-parameter calibration file.

* * * * *